(12) United States Patent
Haimlinger et al.

(10) Patent No.: US 12,471,203 B2
(45) Date of Patent: Nov. 11, 2025

(54) INTERCONNECTION OF PRINTED CIRCUIT BOARDS WITH NANOWIRES

(71) Applicant: AT & S Austria Technologie & Systemtechnik AG, Leoben (AT)

(72) Inventors: Klaus Haimlinger, Kobenz (AT); Christian Hoelzl, St. Marein-Feistritz (AT); Marco Gavagnin, Leoben (AT)

(73) Assignee: AT & S Austria Technologie & Systemtechnik AG, Leoben (AT)

(*) Notice: Subject to any disclaimer, the term of this patent is extended or adjusted under 35 U.S.C. 154(b) by 268 days.

(21) Appl. No.: 18/124,450

(22) Filed: Mar. 21, 2023

(65) Prior Publication Data

US 2023/0319976 A1  Oct. 5, 2023

(30) Foreign Application Priority Data

Mar. 31, 2022 (EP) ..................... 22165931

(51) Int. Cl.
*H05K 3/46* (2006.01)
*H05K 1/02* (2006.01)
*H05K 1/14* (2006.01)

(52) U.S. Cl.
CPC .......... *H05K 1/0213* (2013.01); *H05K 1/144* (2013.01); *H05K 3/46* (2013.01); *H05K 2201/026* (2013.01); *H05K 2201/0379* (2013.01); *H05K 2201/058* (2013.01); *H05K 2203/02* (2013.01)

(58) Field of Classification Search
CPC .......... H05K 1/14–1/148; H05K 3/46
See application file for complete search history.

(56) References Cited

U.S. PATENT DOCUMENTS

| 10,939,545 | B2 | 3/2021 | De La Rosa et al. |
| 2007/0267735 | A1* | 11/2007 | Awano ............ H01L 24/91 977/932 |
| 2017/0294724 | A1 | 10/2017 | Henschel |
| 2018/0063969 | A1 | 3/2018 | Philibert et al. |
| 2019/0133527 | A1 | 5/2019 | Kuisma |
| 2020/0323584 | A1 | 10/2020 | Daly et al. |

FOREIGN PATENT DOCUMENTS

| CN | 112333913 A | 2/2021 |
| DE | 102006031322 A1 | 9/2007 |
| WO | 2009100103 A2 | 8/2009 |

OTHER PUBLICATIONS

"Extended European Search Report received in EP Application No. 22165931.1 on Nov. 28, 2022".

* cited by examiner

*Primary Examiner* — Jeremy C Norris
(74) *Attorney, Agent, or Firm* — ALG Intellectual Property, LLC

(57) ABSTRACT

A carrier assembly may include a first carrier sub-assembly, said first carrier sub-assembly having an elongated shape and comprising at least one electrically conductive layer structure and at least one electrically insulating layer structure, said at least one electrically conductive layer structure extending up to a first area provided on one of two extremities of the elongated shape, wherein a first plurality of conductive nanowires is provided on said first area, and a second carrier sub-assembly, said second carrier sub-assembly comprising at least one electrically conductive layer structure and at least one electrically insulating layer structure, said at least one electrically conductive layer structure comprising a second area, wherein a second plurality of conductive nanowires is provided on that second area.

15 Claims, 7 Drawing Sheets

INTERCONNECTION OF PRINTED CIRCUIT BOARDS WITH NANOWIRES

RELATED APPLICATIONS

The present application claims priority to EP Patent Application No. 22165931.1, filed Mar. 31, 2022, the contents of which are hereby incorporated by reference in their entirety.

BACKGROUND INFORMATION

Sometimes there is the need to interconnect flexible printed circuit boards, also called flexprints. For example, the sensor device may be composed of a plurality of flexible printed circuit boards. At one end, the sensor device carries sensors for measuring electric potentials. The used flexible printed circuit boards may be long but narrow boards and may be assembled to a length of up to 1.5 m.

Usually, the interconnection process between two flexible printed circuit boards is done by soldering each of the individual conductors of the flexible printed circuit boards with each other. This soldering process is very complex and time consuming and may have to be done manually. Furthermore, the solder points may be sensitive to mechanical stress and the interconnection may have to be enforced additionally.

Also, when the two flexible printed circuit boards have fine conductive traces, there may be the need of a strong mechanical connection as well as reliable electrical connection between the respective traces.

BRIEF DESCRIPTION OF THE DRAWINGS

Below, embodiments are described in more detail with reference to the attached drawings.

The reference symbols used in the drawings, and their meanings, are listed in summary form in the list of reference symbols. In principle, identical parts are provided with the same reference symbols in the figures.

DETAILED DESCRIPTION

Figure 1:
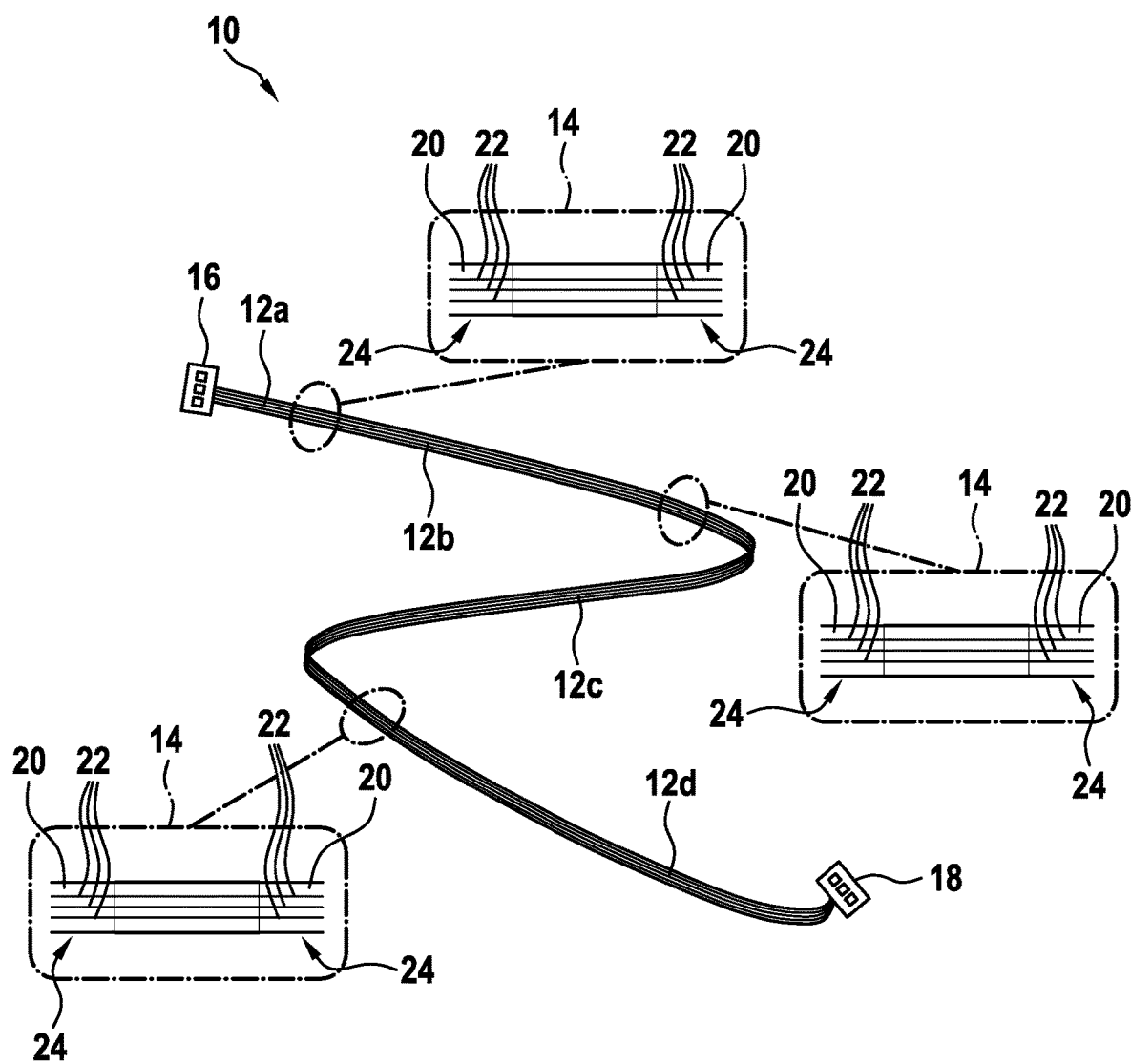
FIG. 1 schematically shows a carrier assembly according to an embodiment.

Described herein are a carrier assembly and to a method of manufacturing a carrier assembly.

The embodiments described herein overcome the above-mentioned problems.

An aspect relates to a carrier assembly. The carrier assembly may be or may comprise a cable, which is composed of carrier sub-assemblies, which may be flexprints or flexible printed circuit boards. The carrier assembly may be flexible and/or may have an elongated shape, where its ratio of length by its width is higher than 10, for example. The smaller sides of the carrier assembly may be seen as its ends.

The length, thickness and width of a carrier sub-assembly may be defined as following: The length may be in the direction of the highest expansion of the carrier sub-assembly. The thickness may be in the direction of the lowest expansion of carrier sub-assembly medium expansion, which may be the direction in which the layers are stacked. The width may be in the direction orthogonal to the length and thickness. A smaller side may be the side along the width and thickness direction.

It may be that the length to width ratio of a carrier sub-assembly is bigger than a factor 10 and/or that the length to thickness ratio is bigger than a factor 50.

Additionally, sensors, actuators and other devices may be connected to ends of the carrier assembly. Also the carrier sub-assemblies may carry electric and/or electronic components.

According to an embodiment, the carrier assembly comprises a first carrier sub-assembly, said first carrier sub-assembly having an elongated shape and comprising at least one electrically conductive layer structure and at least one electrically insulating layer structure, said at least one electrically conductive layer structure extending up to a first area provided on one of two extremities and/or ends of the elongated shape, wherein a first plurality of conductive nanowires is provided on said first area. An extremity may be or may be a part of an end section of the respective carrier sub-assembly. An end section may be a last length of the elongated shape, for example corresponding to less of the 5% of the entire length of the elongated shape of the first carrier sub-assembly, e.g., less than 1%, e.g., less than 0.5%. A length of an end section may be more than 10 µm and up to 10 mm, e.g., between 1 mm and 5 mm.

The electrically conductive layer structure may provide conductive tracks running from one extremity to the other extremity. The conductive tracks may be provided on the electrically insulating layer structure. Between the extremities, the conductive track may be covered on both sides by the at least one electrically insulating layer structure. At the extremities, the conductors and/or conductive tracks may be solely covered on one side by the at least one electrically insulating layer structure. The uncovered part of the electrically conductive layer structure and/or the conducting tracks at one extremity may be the first area.

The electrically conductive layer structure may be made of metal. The electrically insulating layer structure may be made of plastics.

On the first area, conductive nanowires are provided. A nanowire may be a nanostructure in the form of a wire or a pillar. The nanowires may be connected with one end to the first area and may extend substantially orthogonal from the first area, e.g., in the stack direction. The nanowires may be made of metal. The nanowires may have a different length, wherein more than 50% may be within a length range, which is defined by deviating at least 30%, e.g., 20% from an average length.

The first carrier sub-assembly has an elongated shape. This may mean that the two extremities are on a small side of the first carrier sub-assembly and that the long sides of the first carrier sub-assembly are substantially longer than the small sides, such as at least 10 times longer.

According to an embodiment, the carrier assembly comprises a second carrier sub-assembly, said second carrier sub-assembly comprising at least one electrically conductive layer structure and at least one electrically insulating layer structure, said at least one electrically conductive layer structure comprising a second area, wherein a second plurality of conductive nanowires are provided on that second area. The same may applies to the at least one electrically conductive layer structure, the at least one electrically insulating layer structure, the second area and the nanowires, as to the corresponding parts of the first carrier sub-assembly.

According to an embodiment, said first carrier sub-assembly and said second carrier sub-assembly are connected one to each other through a connection of the first plurality of nanowires with the second plurality of nanowires. The connections through nanowires allow a reliable, easy, strong and stable connection between two carrier sub-assemblies, assuring at the same time the electrical connection of the electrically conductive structures provided in each of said sub-assembly.

The first plurality of nanowires and the second plurality of nanowires may be stuck into each other along an extension direction of the nanowires, which may be substantially orthogonal to the first area and the second area. Nanowires of the first plurality of nanowires and the second plurality of nanowires may be connected with each other along their outer surfaces, which are inclined with respect to the first area and the second area. The first area and the second area may run substantially parallel to each other and/or may face each other.

The connection by the nanowires may be a mechanical connection, in which the nanowires mechanically interconnect to the two sub-assemblies. The first plurality of nanowires and the second plurality of nanowires may be intertangled, thus interconnecting the two sub-assemblies. The connection by the nanowires may be an electrical connection, in which the conducting nanowires electrically interconnect the electrically conductive layer structure of the two sub-assemblies.

According to an embodiment, said second carrier sub-assembly has an elongated shape and said at least one electrically conductive layer structure extends up to the second area provided on one of two extremities of the elongated shape. An elongated carrier assembly can be assembled, using several carrier sub-assemblies easily assembled one to each other, assuring at the same time a stable and strong mechanical connection among these carrier sub-assemblies and a reliable electrical connection through the connection, e.g., the intertangling, of said nanowires. As for the first carrier sub-assembly, this may mean that the two extremities are on a small side of the second carrier sub-assembly and that the long sides of the first carrier sub-assembly are substantially longer than the small sides, such as at least 10 time longer. It has to be noted that the extremities of the first carrier sub-assembly and the second carrier sub-assembly, which extremities are connected with each other via the nanowires, may have the same shape and/or the same design.

According to an embodiment, the at least one electrically conductive layer structure of the first carrier sub-assembly and/or the second carrier sub-assembly extends from the first extremity to the second opposed extremity of the elongated shape of the carrier sub-assembly. As already said, the at least one electrically conductive layer structure may comprise conductive tracks.

According to an embodiment, each of the first carrier sub-assembly and the second carrier sub-assembly comprises a plurality of electrically conductive layer structures, at least two of said plurality of electrically conductive layer structures comprising and/or extending up to a respective area where a respective plurality of conductive nanowires is provided, said first carrier sub-assembly and said second carrier sub-assembly being connected one to each other through the connection of each of the pluralities of nanowires provided on the first carrier sub-assembly with the respective one of the pluralities of nanowires provided on the second carrier sub-assembly. Thanks to the use of the nanowires as connecting means, is it possible to connect several electrically connecting structures, e.g., in the form of several tracks, because the nanowires allow the definition of connection area even having small dimensions. Each of the electrically conductive layer structures may be or may comprise a conductive track. A conductive track of the first carrier sub-assembly may be connected to a conductive track of the second carrier sub-assembly via the nanowires.

It may be that a conductive track of the first carrier sub-assembly is connected to at least two conductive tracks of the second carrier sub-assembly. This may be seen as a Y-shaped connection. For example, only for power supply there is no need to have fine line structure and the first carrier sub-assembly has 3 copper tracks. The second carrier sub-assembly may have a fineline structure, for example 6 copper tracks. Said 3 copper tracks of first carrier sub-assembly are conned to 6 copper tracks of the second carrier sub-assembly via 3 Y-shaped structures.

According to an embodiment, at least one electrically conductive layer structure extending up to one and/or the other extremity of one of the first carrier sub-assembly and the second carrier sub-assembly has a shape of a conducting track, which may be substantially straight. The use of the nanowires as connecting means allows the connection of areas with reduced dimensions, such as the extremity of a straight (and, in some examples, thin) conducting track. An alternative would be to have conducting pads instead of conducting tracks at the end.

According to an embodiment, a plurality of conductive tracks is provided on each of the carrier sub-assemblies, e.g., patterned provided along the elongated shape of the respective carrier sub-assembly. More than one conductive track may run substantially in parallel to each other between the two extremities.

According to an embodiment, the first carrier sub-assembly and/or the second carrier sub-assembly is/are flexible carrier sub-assemblies. The first carrier sub-assembly and/or the second carrier sub-assembly may be flexible printed boards and/or flexprints. The use of nanowires as connecting means allows the connection of sub-assemblies even if one or more of those are not rigid, because of the connection done with the nanowires, e.g., the intertangling of the nanowires, that can be also provided on a flexible surface. The at least one electrically insulating layer structure(s) may be made of a flexible material, e.g., a flexible plastics material.

According to an embodiment, the assembled carrier has a shape of a flexible carrier. Each carrier sub-assembly may be flexible and/or the carrier assembly may be flexible.

According to an embodiment, a flexibility of the carrier assembly portion, in particular the corresponding extremity, where the first plurality of nanowires and the second plurality of nanowires are connected, is less than a flexibility of the remaining portion of each carrier sub-assembly. Even if the extremities of the flexible carrier sub-assemblies are connected one to each other, a degree of flexibility of these extremities is assured, because the connection is provided by the connection, e.g., the intertangling, of the plurality of nanowires, limiting the mechanical constraint of the remaining portions of the carrier sub-assemblies. This may be due to further components attached and/or provided at these portions, such as a protection cover. It also may be that the nanowires are cast into a resin material, which also may make these portions stiffer.

According to an embodiment, the carrier assembly comprises one or more further carrier sub-assemblies, e.g., each having an elongated shape and an at least one electrically conductive structure extending up to a respective further area provided on one of the two extremities of the elongated shape, wherein a further plurality of conductive nanowires is provided on the respective area, so that each carrier sub-assembly and each respective at least one electrically conductive structure are connected one to the first, the second or a further carrier sub-assembly through the respective pluralities of nanowires. The carrier assembly may be a chain of carrier sub-assemblies, which are connected at their ends like the first and second carrier sub-assemblies as described above and below.

According to an embodiment, a component is provided on said first and/or second and/or further carrier sub-assembly. Such a component may be a connector and/or a sensor at the extremity. For example, carrier assembly may be a sensor device composed of a plurality of carrier sub-assemblies as described herein with a sensor at one end and a connector at the other end.

According to an embodiment, said first and second pluralities of nanowires are configured to at least partially intertangle and/or tangle said first and second pluralities of nanowires one to each other. First nanowires of the first plurality of nanowires and second nanowires of the second plurality of nanowires are intertangled with each other to generate a mechanical interconnection between the extremities of the first and second sub-assembly. Due to the mechanical interconnection, an electrical interconnection between the first carrier sub-assembly and the second carrier sub-assembly may be created.

According to an embodiment, the average length ratio of each nanowire contacting at least one adjacent nanowire with respect to the respective entire nanowire length is at least 5%. This minimum contact value assures a proper mechanical and electrical interconnection of two nanowires. Here, "adjacent" may mean that the two nanowires belong to the opposed and connected plurality of nanowires, i.e. one nanowire to the first plurality of nanowires and the other one to the second plurality of nanowires.

According to an embodiment, at least one nanowire contacting at least one adjacent nanowire is partially fused with said adjacent nanowire. This may enhance the mechanical and electrical interconnection of two carrier sub-assemblies through nanowires. The materials of the two nanowires may have fused into each other. This may be achieved by applying pressure and/or heat to the nanowires during the interconnection process. The interconnection process may be the stacking of the extremities of the first and second sub-assemblies to be interconnected with each other. During stacking, the nanowires of the first plurality of nanowires and the nanowires of the second plurality of nanowires may be pushed into each other and optionally pressure and/or heat may be applied.

According to an embodiment, between two connected pluralities of nanowires, an underfilling material is provided. This enhance the reliability of the mechanical interconnection of two carrier sub-assemblies. The underfilling material may be a resin material that is provided between the nanowires during the stacking. The resin material may cure after and/or during the stacking. Curing may be done by applying heat.

According to an embodiment, said pluralities of nanowires comprise a plurality of vertical nanowires. Thus, shorter nanowires to connect the two carrier subassemblies may be used. Further, an excessive deformation of the nanowires during their connection may be prevented due to the resulting vertical extension of the recesses from which the opposed nanowires are inserted. The nanowires may extend substantially orthogonal to the first and/or second area. In particular, the nanowires may have an angle between 45-135°, e.g., 70-110° or 80-100° to the first and/or second area.

The elongation direction for the nanowires may be parallel to each other. Additionally and/or alternatively, it may be that at least 20% of the nanowires are pointing towards different directions. In this way, intertangling is eased.

According to an embodiment, said pluralities of nanowires comprise an array of nanowires within said first or second or further area. In this way, a good definition of the spaces among the nanowires may be achieved. For example, the nanowires within one area may be arranged in an orthogonal grid and/or a hexagonal grid. The nanowires within one area may be equally spaced with respect to neighboring nanowires.

According to an embodiment, said pluralities of nanowires are randomly distributed within the first or the second or a further area. This may allow an easier manufacturing process to realize the nanowires. This may mean that the connection points of the nanowire to the respective area are not regularly distributed and/or are not equally spaced.

According to an embodiment, at least one of the areas, where the respective plurality of nanowires is provided, has a planar shape with a roughness of at least the value of a nanowire diameter. The first and/or second area may have a substantially planar surface on which the nanowires are attached. The outer shape of the surface may be substantially rectangular, however, the outer borders may be irregular, i.e. need not be straight lines. The roughness of a border of the first and/or the second area may be of at least the value of a nanowire diameter.

According to an embodiment, at least one of the areas where the respective plurality of nanowires is provided has a planar elongated shape, e.g., along the elongated shape of the respective carrier sub-assembly. Here, elongated shape may mean that at least one of the areas where a respective plurality of conductive nanowires is provided has a ratio between the width and the height, in particular along the carrier sub-assembly elongation, of more than 1.

According to an embodiment, at least one of the areas, where a respective plurality of conductive nanowires is provided, such as the first area and/or the second area, has a different width with respect to the width of the connected electrically conductive layer structure. Consequently, the area where the nanowires are provided is adapted to the process and to physical/mechanical requirements for the provision of the respective plurality of nanowires, also taking into consideration the required clearances for the opposed nanowires placement in between, to assure the connection of the two carrier sub-assemblies.

The conductive track may become smaller, when they reach the first and/or second area. With smaller area, undue connections between nanowires of neighbouring areas/electrically conductive structures/traces are prevented, because of the resulting larger clearances in between. This may decrease the danger that nanowires of one area get in contact with a neighbouring area on the same sub-assembly. On the other hand, the width can be larger, when the track-to-track distance allows it, in order to decrease the resistance selectively in the areas where nanowires are provided.

According to an embodiment, each of said plurality of nanowires has an average diameter in the range of 10 nm to 5 µm and/or has an average length in the range of 30 nm to 100 µm, e.g., 300 nm to 50 µm.

A further aspect relates to a method of manufacturing a carrier assembly, for example a carrier assembly, such as described above and below. It has to be understood that features of the method as described above and below may be features of the carrier assembly as described above and below, and vice versa.

According to an embodiment, the method comprises:
providing a first carrier sub-assembly, said first carrier sub-assembly having an elongated shape and comprising at least one electrically conductive layer structure and at least one electrically insulating layer structure, said at least one electrically conductive layer structure extending up to a first area provided on one of the two extremities of the elongated shape, wherein a first plurality of conductive nanowires is provided on said first area;
providing a second carrier sub-assembly, said second carrier sub-assembly comprising at least one electrically conductive layer structure and at least one electrically insulating layer structure, said at least one electrically conductive layer structure comprising a second area, wherein a second plurality of conductive nanowires are provided on said second area;
stacking said first carrier sub-assembly and said second carrier sub-assembly connecting one to each other through the connection of the first plurality of nanowires with the second plurality of nanowires.

A first and a second sub-assembly, such as described above and below, are arranged opposite to each other, such that the first plurality of nanowires on the first area faces the second plurality of nanowires on the second surface. After that, the sub-assemblies are pushed towards each other, such that the nanowires are pushed into each other. Additionally and/or alternatively the nanowires of the first carrier sub-assembly may be pushed into a portion of an area delimited by the nanowires of the second carrier sub-assembly. In other or additional words, the nanowires of the first carrier sub-assembly may be provided in the empty space between the nanowires of the second carrier sub-assembly.

According to an embodiment, the step of stacking comprises the application of pressure on the first carrier sub-assembly and/or on the second carrier sub-assembly. Such a pressure may help that the nanowires intertangle with each other and/or fuse with each other.

According to an embodiment, the step of stacking also comprises the application of heat on the areas where the first and/or the second and/or further pluralities of nanowires are provided. The heating may help that the nanowires in contact fuse with each other and/or that a filling material between the nanowires cures. A high temperature may be more than 100° C., in particular more than 200° C. It may be that heat and pressure are applied to obtain a welding process, which may be called thermocompression bonding.

According to an embodiment, the step of stacking can be accomplished also by ultrasonic bonding, during which rather than heat an ultrasonic energy can produce a solid-state welding among the nanowires and the first and second surfaces. A further approach can comprise both heat and ultrasonic energy, in which case the welding process is also called Thermosonic bonding.

Each carrier sub-assembly may be manufactured in the following way: A component carrier comprising a stack comprising a plurality of electrically conductive layer structure and at least one layer of electrically insulating layer structure may be provided. The connection of the layer structures may be achieved by applying heat and/or pressure. The at least one electrically insulating layer structure may be formed of the one or more layers of electrically insulating material.

The electrically conductive layer may be structured within one layer. Electrically conductive layers may be connected via vertical connections, so called vias. Vias may connect electrically conductive layer, which are separated by one insulating layer. Plated trough connections may connect more conductive layers, also connection through the entire stack thickness.

The electrically conductive material may comprise metals, such as copper, gold, silver, aluminium, palladium, nickel. The electrically insulating material may be a resin material comprising polyepoxides, polyamide, polyimide etc. The electrically insulating material may be resin-forced.

Components (for example active or passive components) may be surface mounted on and or embedded in the carrier sub-assembly. A surface finish may be applied to prevent oxidation of copper. The surface finish may be made of nickel, gold, tin and/or photoresist. These and other aspects will be apparent from and elucidated with reference to the embodiments described hereinafter.

FIG. 1 shows a carrier assembly 10, which is composed of carrier sub-assemblies 12a, 12b, 12c, 12d. Each of the carrier sub-assemblies may be a flexible printed circuit board. The carrier sub-assemblies 12a, 12b, 12c, 12d are interconnected into a chain via connection zones 14 as indicated in FIG. 1. The connection zones 14 are shown enlarged, as illustrated by the circles connected by a line to the rectangles. The carrier sub-assemblies 12a, 12b, 12c, 12d all have an elongated shape, i.e. their width is substantially smaller than their length.

At its ends, the carrier assembly 10 may comprise components 16, 18, which are connected to the carrier sub-assembly 12a and the carrier sub-assembly 12d, respectively. For example, the component 16 is a connector and/or the component 18 is a sensor. The carrier assembly 10 may be a sensor device, which may be connected to an evaluation device with the connector 16 and which may sense electric potentials with the sensor 18. It has to be understood that the sensor device and/or the carrier assembly may be encased in a flexible tube and/or other housing components.

Each carrier sub-assembly 12a, 12b, 12c, 12d comprises at least one electrically insulating layer structure 20 and at least one electrically conductive layer structure 22. An electrically insulating layer structure 20 may be a layer of a flexible, electrically insulating material. An electrically conductive layer structure 22 may be made of metal and/or a conductive material. An electrically conductive layer structure 22 may be a conductive track and/or track on one electrically insulating layer structure 20 and/or between two electrically insulating layer structures 20.

Each carrier sub-assembly 12a, 12b, 12c, 12d has an elongated shape with two extremities 24. An extremity 24 may be seen as an end section of the respective sub-assembly 12a, 12b, 12c, 12d. The at least one electrically conductive layer structure 22 of each carrier sub-assembly 12a, 12b, 12c, 12d may extend from the first extremity 24 to the second extremity 24 of the elongated shape of the respective carrier sub-assembly.

In the connection zones 14, two carrier sub-assemblies 12a, 12b, 12c, 12d overlap each other at their extremities 24 with respect to a view direction onto the extension direction of the layers of the layer structures 20, 22.

In the connection zones 14, the carrier sub-assemblies 12a, 12b, 12c, 12d are connected with each other, such as described in the following drawings. In the following drawings, the interconnection of two carrier sub-assemblies 12a, 12b and the forming of the respective connection zone 14 is described. However, the same applies also to the other connection zones 14 between the carrier sub-assemblies 12b, 12c and 12d.

Figure 2:
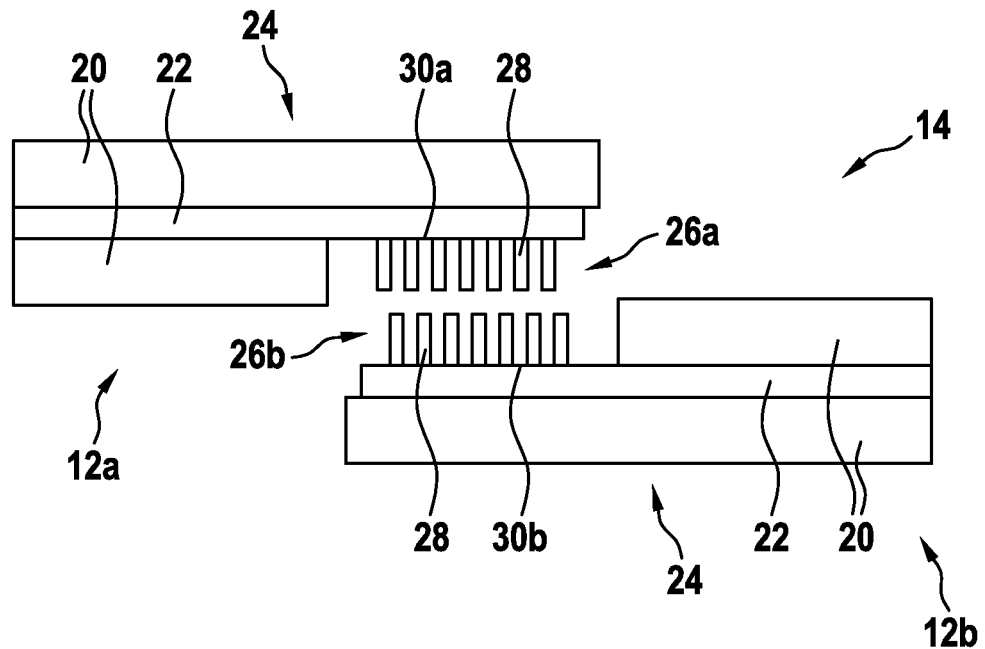
FIG. 2 shows a schematic side view of two extremities of two carrier sub-assemblies before stacking.
Figure 3:
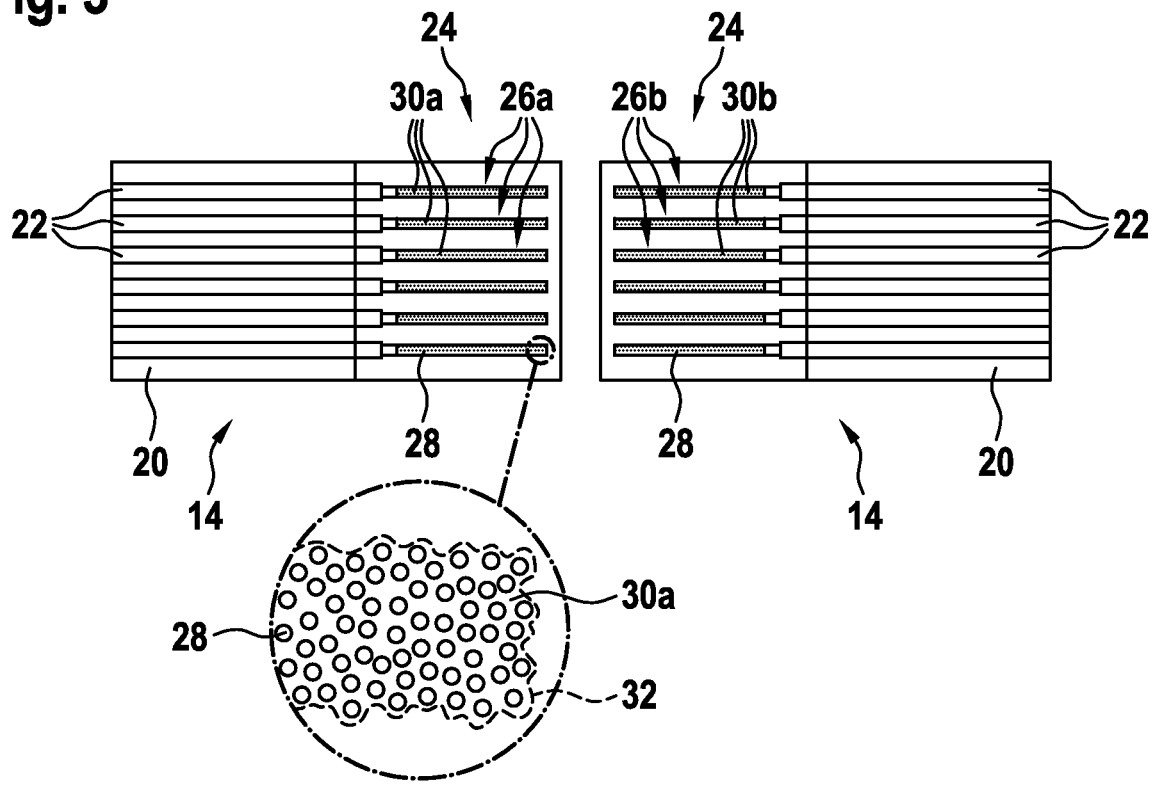
FIG. 3 shows a schematic top view of two extremities of two carrier sub-assemblies before stacking.

FIGS. 2 and 3 show the connection zone 14 of the carrier sub-assemblies 12a, 12b before an interconnection, wherein FIG. 2 is a schematic cross-sectional side view and FIG. 3 is a schematic cross-sectional top view.

FIGS. 2 and 3 show that each carrier sub-assembly 12a, 12b may comprise two electrically insulating layer structures 20, each of which is a layer of electrically insulating material. Between the two electrically insulating layer structures 20, a plurality of electrically conductive layer structures 22 in the form of parallel conductive tracks 22 may be sandwiched. The conductive tracks 22 may run in parallel along an extension direction of the respective carrier sub-assembly 12a, 12b. One of the electrically insulating layer structures 20 is longer than the other electrically insulating layer structure 20 in the extension direction and/or protrudes over the electrically conductive layer structures 22.

The electrically conductive layer structures 22 and/or the conductive track 22 of each carrier sub-assembly 12a, 12b leave the other electrically insulating layer structure 20 in elongation direction and in this way, an area 30a, 30b on the electrically conductive layer structures 22 of each carrier sub-assembly 12a, 12b is provided, which is not covered by the other electrically insulating layer structure 20.

The electrically conductive layer structures 22 extend up to areas 30a, 30b provided on one of the two extremities 24. A first area 30a is provided on the first carrier sub-assembly 12a. A second area 30b is provided on the second carrier sub-assembly 12b. The areas 30a, 30b may have a substantially rectangular shape, which is elongated in the direction into which the conductive tracks 22, the connected electrically conductive layer structure 22 and/or the respective carrier sub-assembly 12a, 12b extends.

Each of the areas 30a, 30b may have a different width with respect to the width of the respective connected electrically conductive layer structure 22. The areas 30a, 30b are substantially plane, wherein the extension direction of the plane is parallel to the electrically conductive layer structures 22 and/or the electrically insulating layer structures 20.

On each of the first areas 30a, a first plurality 26a of conductive nanowires 28 is provided and on each of the second areas 30b, a second plurality 26b of conductive nanowires 28 is provided. The nanowires all may extend substantially orthogonal to the areas 30a, 30b, i.e. may be vertically aligned with respect to the areas 30a, 30b. The nanowires 28 may have an average diameter in the range of 10 nm to 5 μm and/or have an average length in the range of 30 nm to 100 μm, e.g., 300 nm to 50 μm.

As shown in FIG. 3, where a tip of one area 30a is shown magnified, each plurality 26a, 26b of nanowires 28 may be composed of an array of nanowires 28 within the areas 30a, 30b. The nanowires 28 may be randomly distributed within the areas 30a, 30b. The areas 30a, 30b may have an irregular border 30, with a roughness of at least the value of a nanowire diameter.

Figure 4:
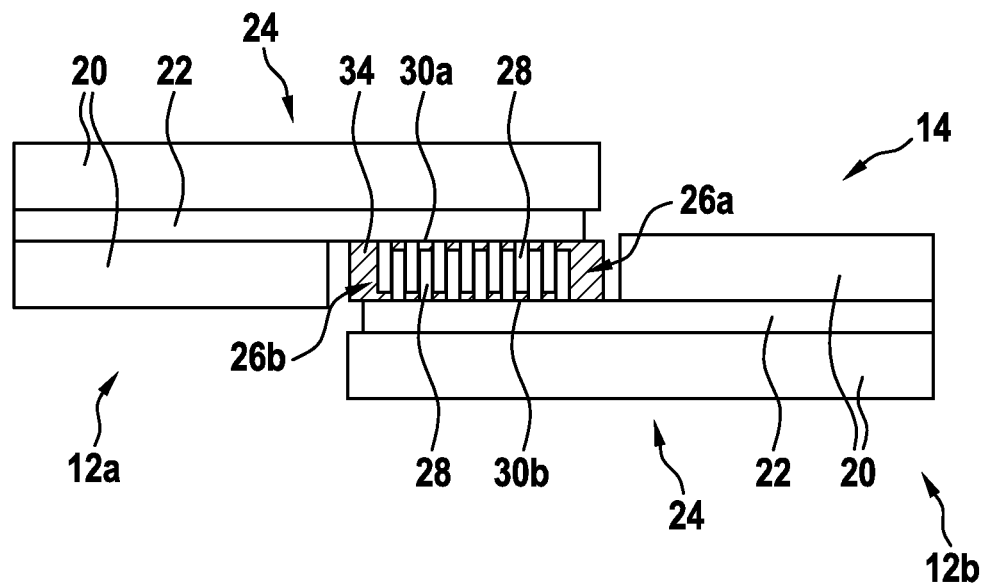
FIG. 4 shows a schematic side view of two extremities of two carrier sub-assemblies after stacking.
Figure 5:
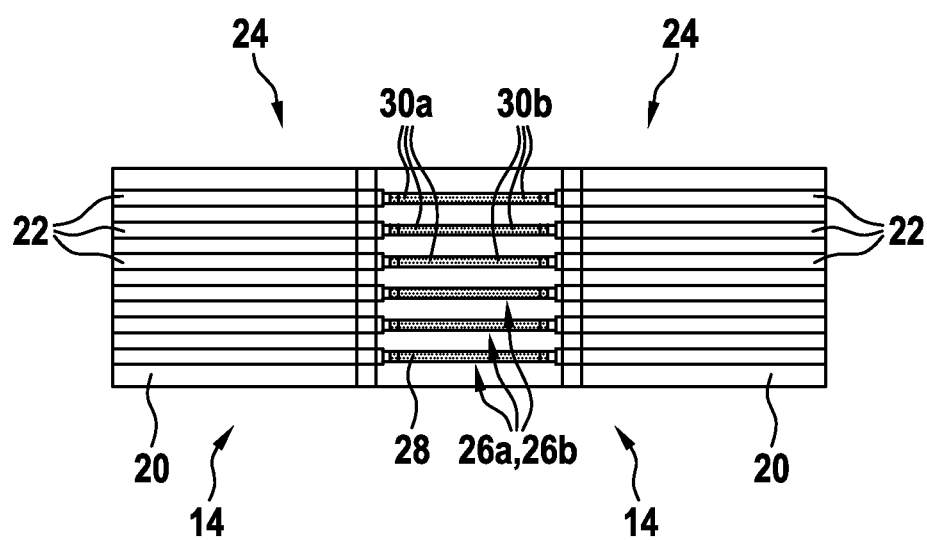
FIG. 5 shows a schematic top view of two extremities of two carrier sub-assemblies after stacking.

FIGS. 4 and 5 show the connection zone 14, after the connection of the two carrier sub-assemblies 12a, 12b. In particular, the first carrier sub-assembly 12a and the second carrier sub-assembly 12b are connected one to each other through a connection of the first plurality 26a of nanowires 28 with the second plurality 26b of nanowires 28.

The two carrier sub-assemblies 12a, 12b and in particular the first plurality 26a of nanowires 28 and the second plurality 26b of nanowires 28 have been shifted into each other along the direction into which the nanowires 28 extend and/or the direction orthogonal to the planes of the areas 30a, 30b. During the shifting and/or afterwards, a pressure and/or a higher temperature may be applied to the connection zone 14.

The average length ratio of each nanowire 28 of the first plurality 26a contacting at least one adjacent nanowire 28 of the second plurality 26b with respect to the respective entire nanowire length may be at least 5% up to 95%. It may be that the tips of the nanowires 28, which are opposite to the tips, where the nanowires 28 are attached to the respective area 30a, 30b, do not touch the opposite area 30a, 30b.

The pluralities 26a, 26b of nanowires 28 may be configured to at least partially intertangle with each other. This may mean that some of the nanowires 28 of the first plurality 26a wrap around other nanowires 28 of the second plurality 26b.

It also may be that some of the nanowires 28 of the first plurality 26a are fused with nanowires 28 of the second plurality 26b. This may mean that the contact area of the nanowires 28 are at least partially fused with each other.

As a further measure, an underfilling material 34, such as a resin, which is curing after the connection process, may be provided between two connected pluralities 26a, 26b of nanowires 28.

Also this may result in that the flexibility of the carrier assembly portion and/or the connection zone 14, where the first plurality 26a of nanowires 28 and the second plurality 26b of nanowires 28 are connected, is less than a flexibility of the remaining portion of each carrier sub-assembly 12a, 12b. In other words, the connection zone 14 may be stiffer than the rest of the carrier sub-assemblies 12a, 12b.

Figure 6:
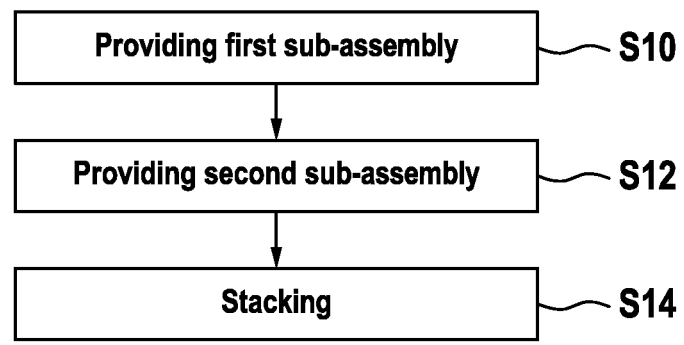
FIG. 6 shows a flow diagram for a method of manufacturing a carrier assembly according to an embodiment.

FIG. 6 shows a flow diagram for a method of manufacturing a carrier assembly 10, such as shown in the previous drawings.

In step S10, a first carrier sub-assembly 12a is provided. The first carrier sub-assembly 12a has an elongated shape and comprises at least one electrically conductive layer structure 22 and at least one electrically insulating layer structure 20. The at least one electrically conductive layer structure 22 extends up to a first area 30a provided on one of two extremities 24 of the elongated shape, wherein a first plurality 26a of conductive nanowires 28 is provided on said first area 30a. The first carrier sub-assembly 12a may be made such as described in FIGS. 1 to 5.

In step S12, a second carrier sub-assembly 12b is provided. The second carrier sub-assembly 12b comprises at least one electrically conductive layer structure 22 and at least one electrically insulating layer structure 20. The at least one electrically conductive layer structure 22 comprises a second area 30b, wherein a second plurality 26b of conductive nanowires 28 is provided on said second area 30b. Also, the second carrier sub-assembly 12b may have an elongated shape and/or may be made such as described in FIGS. 1 to 5.

In step S14, the first carrier sub-assembly 12a and the second carrier sub-assembly 12b are connected one to each other through the connection of the first plurality 26a of nanowires 28 with the second plurality 26b of nanowires 28. This may be done such as described with respect to FIGS. 4 and 5. During step S14, a pressure may be applied on the first carrier sub-assembly 12a and/or on the second carrier sub-assembly 12b. Also, a high temperature and/or other forms of energy may be applied on the areas 30a, 30b.

Figure 7:
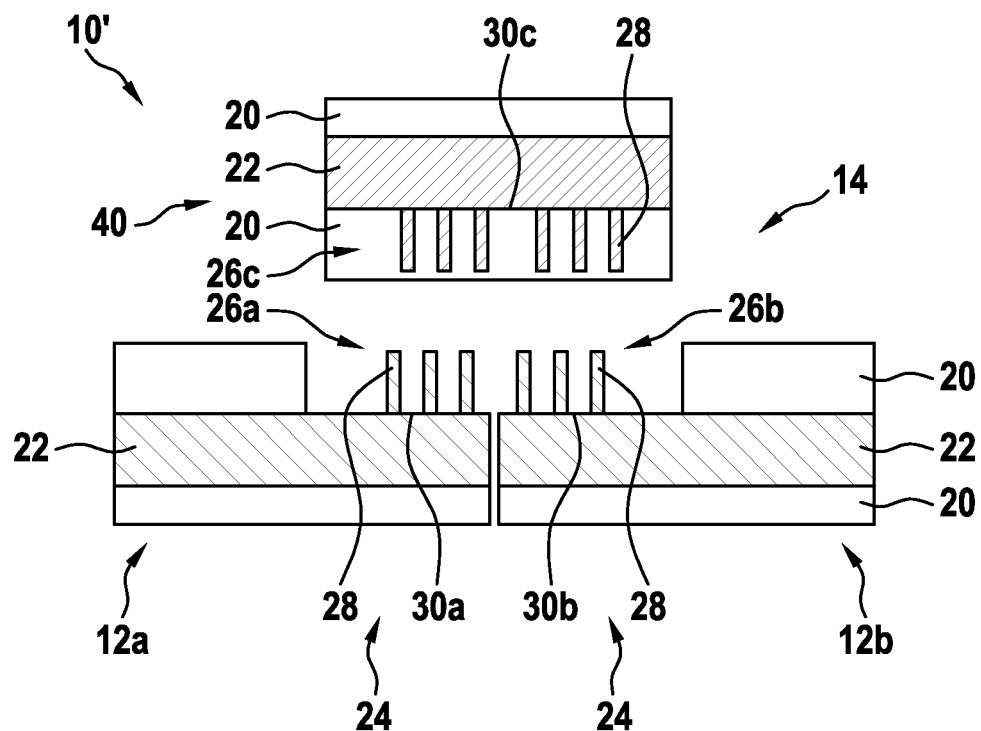
FIG. 7 shows a schematic side view of two extremities of two carrier sub-assemblies before stacking.
Figure 8:
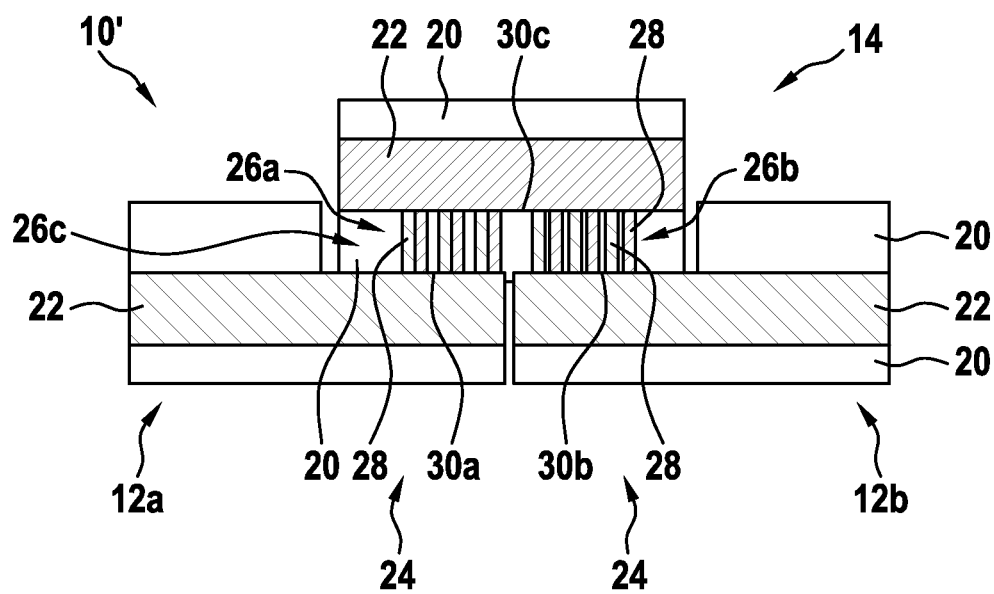
FIG. 8 shows a schematic side view of two extremities of two carrier sub-assemblies after stacking.

FIGS. 7 and 8 show a part of a carrier assembly 10', which is composed of two carrier sub-assemblies 12a, 12b, which are interconnected at their extremities 24 with an intermediate piece 40. FIG. 7 shows the part of the carrier assembly 10' before stacking. FIG. 8 shows the part of the carrier assembly 10' after stacking.

The sub-assemblies 12a, 12b may be designed like the ones described with respect to FIGS. 2 to 4.

The intermediate piece 40 may comprise two electrically insulating layer structures 20, each of which is a layer of electrically insulating material. Between the two electrically insulating layer structures 20, a at least one electrically conductive layer structure 22 in the form of parallel conductive tracks 22 may be sandwiched. The conductive tracks 22 of the intermediate piece 40 may run in parallel along an extension direction of the intermediate piece 40. This extension direction may direct from the first carrier sub-assembly 12a to the second carrier sub-assembly 12b.

Each of the one or more electrically conductive layer structures 22 of the intermediate piece 40 comprises an area 30c on which a third plurality 26c of conductive nanowires 28 is provided. The area 30c may be substantially plane, wherein the extension direction of the plane is parallel to the electrically conductive layer structures 22 and/or the electrically insulating layer structures 20 of the intermediate piece 40. The area 30c of the intermediate piece 40. faces the areas 30a, 30b of the carrier sub-assemblies 12a, 12b.

All the nanowires 28 may extend substantially orthogonal to the areas 30a, 30b, 30c, i.e. may be vertically aligned with respect to the areas 30a, 30b, 30c.

Once the extremities of the two carrier sub-assemblies 12a, 12b have been aligned with the intermediate piece 40, in other words once the areas 30a and 30b provided on the respective extremities of the two carrier sub-assemblies 12a, 12b have been aligned with the area 30c of the intermediate piece 40 so that the nanowires the first and the second plurality of nanowires are faced to the third plurality of nanowires, the intermediate piece 40 is shifted against the respective two carrier sub-assemblies 12a, 12b, in some examples applying pressure and/or temperature so that said first carrier sub-assembly (12a), said second carrier sub-assembly (12b) and said intermediate piece 40 are connected one to each other through the connection of the first plurality 26a of nanowires 28 and the second plurality 26b of nanowires 28 with the third plurality 26c of nanowires 28.

In some examples, the shift is performed into a direction in which the nanowires 28 extend and/or the direction orthogonal to the planes of the areas 30a, 30b, 30c.

In accordance with an embodiment, FIG. 8 shows the connection zone 14, after the connection of the two carrier sub-assemblies 12a, 12b via the intermediate piece 40. The first carrier sub-assembly 12a and the intermediate piece 40 may be connected one to each other through a connection of the first plurality 26a of nanowires 28 with a first half of the third plurality 26c of nanowires 28. The second carrier sub-assembly 12b and the intermediate piece 40 may be connected one to each other through a connection of the second plurality 26b of nanowires 28 with a second half of the third plurality 26c of nanowires 28.

The pluralities 26a and 26c as well as 26b and 26c of nanowires 28 may be configured to at least partially intertangle with each other. This may mean that some of the nanowires 28 of the first plurality 26a (or second plurality 26b) wrap around other nanowires 28 of the third plurality 26c.

It also may be that some of the nanowires 28 of the first plurality 26a (or the second plurality 26b) are fused with nanowires 28 of the third plurality 26c. This may mean that the contact area of the nanowires 28 are at least partially fused with each other.

The embodiment disclosed above and shown in FIGS. 2 to 5 and/or FIGS. 7 to 8 can be applied to one or more further carrier sub-assemblies that can be connected with one extremity of the first or the second carrier sub-assemblies 12a, 12b and/or between said first or second carrier sub-assemblies 12a, 12b; on this purpose a long component carrier can be obtained, as shown in FIG. 1, where the carrier sub-assemblies 12a, 12b, 12c, 12d are each interconnected into a chain using the nanowire connections as above disclosed and as shown in FIGS. 2 to 5 and/or FIGS. 7 to 8.

Figure 9A:
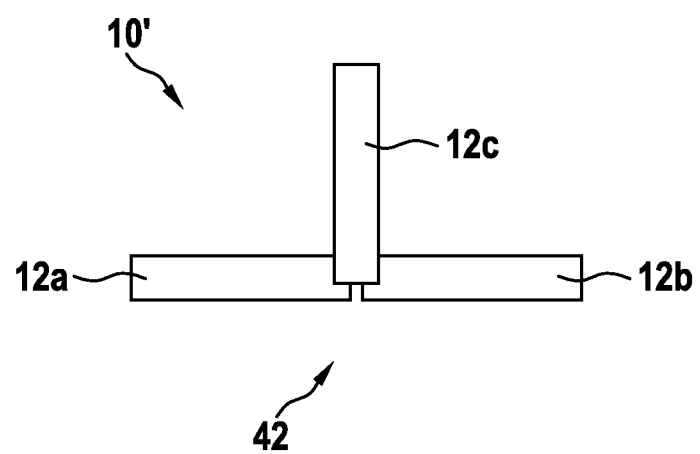
FIG. 9A to 9D schematically show carrier assemblies, which are tree-shaped connected.
Figure 9B:
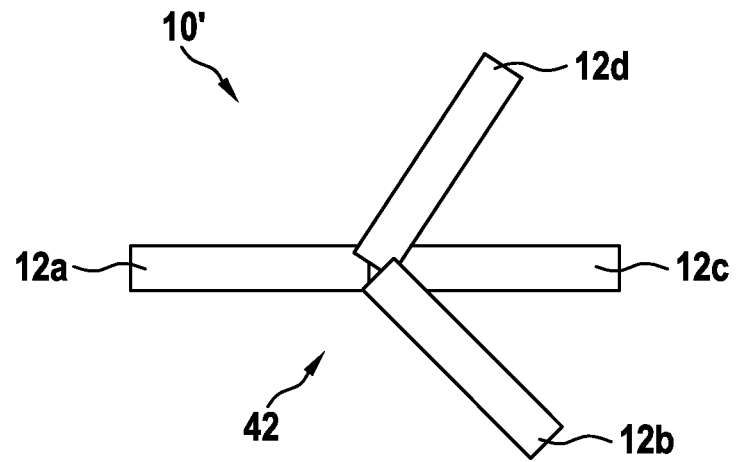
Figure 9C:
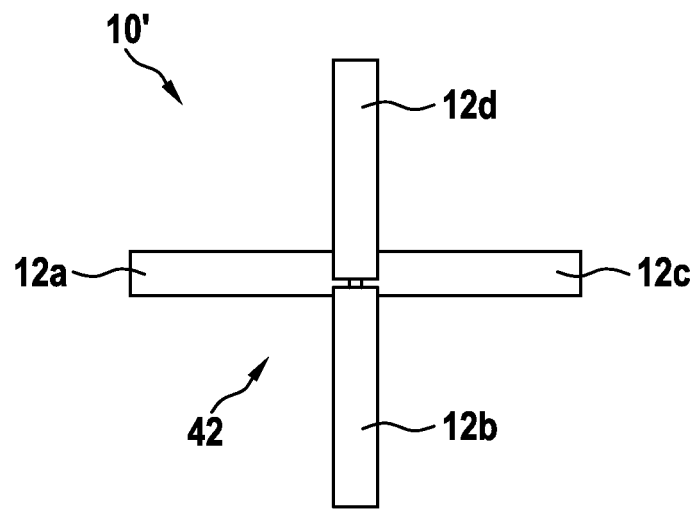
Figure 9D:
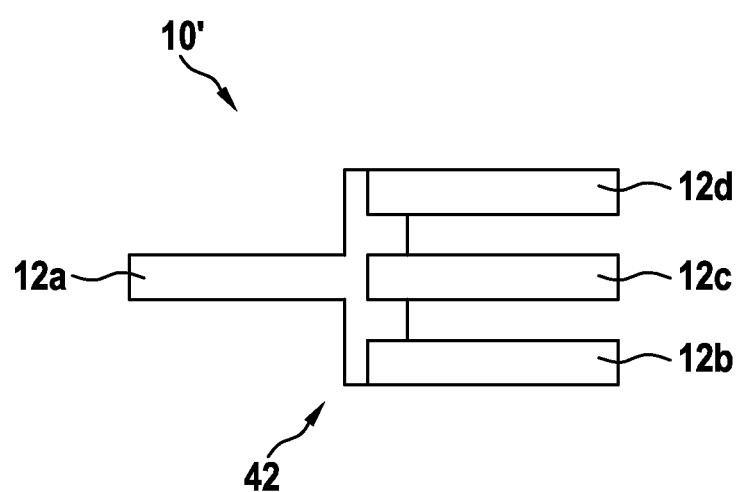

Alternatively, the further carrier sub-assembly can be connected to the first and/or the second carrier sub-assemblies 12a, 12b to obtain different resulting shape; for example, different configuration of the carrier assembly can be provided as shown on FIGS. 9D to 9D.

FIG. 9A to 9D schematically show carrier assemblies 10', which are tree-shaped connected. Each carrier assembly 10' is composed of carrier sub-assemblies 12a, 12b, 12c, 12d, such as described with respect to FIG. 2-5, 7, 8. Contrary to the embodiment shown in FIG. 1, the carrier sub-assemblies 12a, 12b, 12c, 12d are not connected into a chain, but are connected tree-shaped, i.e. there is a branching zone 42, where at least three carrier sub-assemblies 12a, 12b, 12c, 12d are connected with each other.

In some examples, the connection between two of the carrier sub-assemblies 12a, 12b, 12c, 12d can be either made directly, like shown in FIG. 2-5 or with indirectly with the aid of intermediate pieces 40, such as shown in FIG. 7,8. In general, there is a connection of nanowires to mechanically and electrically interconnect the carrier sub-assemblies 12a, 12b, 12c, 12d.

In FIG. 9A, there are two carrier sub-assemblies 12a, 12b connected into a string, while a third carrier sub-assembly 12c branches of the two carrier sub-assemblies 12a, 12b in the branching zone 42, e.g., perpendicularly provided with respect to the linear extension of the two carrier sub-assemblies 12a, 12b.

In FIG. 9B, the carrier sub-assembly 12a is connected with each of the carrier sub-assemblies 12b, 12c, 12d, resulting in a broom-shaped arrangement of the carrier sub-assemblies 12a, 12b, 12c, 12d.

In FIG. 9C, every carrier sub-assembly 12a, 12b, 12c, 12d is connected with every other carrier sub-assembly 12a, 12b, 12c, 12d. This result in a cross-shaped arrangement of the carrier sub-assemblies 12a, 12b, 12c, 12d.

In FIG. 9D, the sub-assembly 12a has an extremity 24, which provides several areas for connecting further carrier sub-assemblies 12b, 12c, 12d. Each of the carrier sub-assemblies 12b, 12c, 12d is connected to another one of these areas.

While the embodiments described herein have been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art and practising the claimed invention, from a study of the drawings, the disclosure, and the appended claims. In the claims, the word "comprising" does not exclude other elements or steps, and the indefinite article "a" or "an" does not exclude a plurality. A single processor or controller or other unit may fulfil the functions of several items recited in the claims. The mere fact that certain measures are recited in mutually different dependent claims does not indicate that a combination of these measures cannot be used to advantage. Any reference signs in the claims should not be construed as limiting the scope.

LIST OF REFERENCE SYMBOLS 10 carrier assembly
10' carrier assembly
12a first carrier sub-assembly
12b second carrier sub-assembly
12c third carrier sub-assembly
12d fourth carrier sub-assembly
14 connection zone
16 component, connector
18 component, sensor
20 electrically insulating layer structure
22 electrically conductive layer structure
24 extremity/end section
26a first plurality of nanowires
26b second plurality of nanowires
26c third plurality of nanowires
28 nanowire
30a first area
30b second area
30c third area
32 border
40 intermediate piece
42 branching zone

What is claimed is:

1. A carrier assembly, wherein the carrier assembly comprises:
    a first carrier sub-assembly, said first carrier sub-assembly having an elongated shape and comprising at least one electrically conductive layer structure and at least one electrically insulating layer structure, said at least one electrically conductive layer structure extending from a first extremity to a second extremity of the elongated shape of the first carrier sub-assembly, said at least one electrically conductive layer extending up to a first area provided on one of the first and second extremities of the elongated shape, wherein a first plurality of conductive nanowires is provided on said first area, and
    a second carrier sub-assembly, said second carrier sub-assembly comprising at least one electrically conductive layer structure and at least one electrically insulating layer structure, said at least one electrically conductive layer structure comprising a second area, wherein a second plurality of conductive nanowires is provided on that second area,
    said first carrier sub-assembly and said second carrier sub-assembly being connected one to each other through a connection of the first plurality of nanowires with the second plurality of nanowires.

2. The carrier assembly according to claim 1, wherein said second carrier sub-assembly has an elongated shape, said at least one electrically conductive layer structure extending from a first extremity to a second extremity of the elongated shape of the second carrier sub-assembly, said at least one electrically conductive layer extending up to the second area provided on one of the first and second extremities of the elongated shape.

3. The carrier assembly according to claim 1, wherein each of the first carrier sub-assembly and the second carrier sub-assembly comprises a plurality of electrically conductive layer structures, at least two of said plurality of electrically conductive layer structures comprising and/or extending up to a respective area where a respective plurality of conductive nanowires is provided, said first carrier sub-assembly and said second carrier sub-assembly being connected one to each other through the connection of each of the pluralities of nanowires provided on the first carrier sub-assembly with the respective one of the pluralities of nanowires provided on the second carrier sub-assembly.

4. The carrier assembly according to claim 1, wherein the at least one electrically conductive layer structure extending up to one and/or the other extremity of one of the first carrier sub-assembly and the second carrier sub-assembly has a shape of a conducting track.

5. The carrier assembly according to claim 4, wherein a plurality of conductive tracks are provided on each of the carrier sub-assemblies.

6. The carrier assembly according to claim 1, wherein the first carrier sub-assembly and/or the second carrier sub-assembly is/are flexible carrier sub-assemblies.

7. The carrier assembly according to claim 1, wherein the carrier assembly comprises one or more further carrier sub-assemblies, each having an elongated shape and an at least one electrically conductive structure extending up to a respective further area provided on one of the two extremities of the elongated shape, wherein a further plurality of conductive nanowires is provided on the respective area, so that each carrier sub-assembly and each respective at least one electrically conductive structure are connected one to the first, the second or a further carrier sub-assembly through the respective pluralities of nanowires.

8. The carrier assembly according to claim 1, wherein a component is provided on said first and/or second and/or a further carrier sub-assembly.

9. The carrier assembly according to claim 1 wherein said first and second pluralities of nanowires are configured to at least partially intertangle said first and second pluralities of nanowires one to each other.

10. The carrier assembly according to claim 9, wherein at least one nanowire contacting at least one adjacent nanowire is partially fused with said adjacent nanowire.

11. The carrier assembly according to claim 1, wherein between two connected pluralities of nanowires, an underfilling material is provided.

12. The carrier assembly according to claim 1, wherein at least one of the areas where a respective plurality of conductive nanowires is provided has a smaller width with respect to the width of the connected electrically conductive layer structure.

13. The carrier assembly according to claim 1, wherein each of said plurality of nanowires has an average diameter in the range of 10 nm to 5 µm and/or has an average length in the range of 30 nm to 100 um.

14. A method of manufacturing a carrier assembly, the method comprising:
    providing a first carrier sub-assembly, said first carrier sub-assembly having an elongated shape and comprising at least one electrically conductive layer structure and at least one electrically insulating layer structure, said at least one electrically conductive layer structure extending from a first extremity to a second extremity of the elongated shape of the first carrier sub-assembly, said at least one electrically conductive layer extending up to a first area provided on one of the first and second extremities of the elongated shape, wherein a first plurality of conductive nanowires is provided on said first area;

providing a second carrier sub-assembly, said second carrier sub-assembly comprising at least one electrically conductive layer structure and at least one electrically insulating layer structure, said at least one electrically conductive layer structure comprising a second area, wherein a second plurality of conductive nanowires is provided on said second area;

stacking said first carrier sub-assembly and said second carrier sub-assembly connecting one to each other through the connection of the first plurality of nanowires with the second plurality of nanowires.

15. The method according to claim 14, wherein:

the step of stacking comprises the application of pressure on the first carrier sub-assembly and/or on the second carrier sub-assembly, and/or the step of stacking also comprises the application of high temperature on the areas where the first and/or the second pluralities of nanowires are provided.

* * * * *